United States Patent
Mukohara et al.

(10) Patent No.: US 12,382,620 B2
(45) Date of Patent: Aug. 5, 2025

(54) TAPE FEEDER

(71) Applicant: FUJI CORPORATION, Chiryu (JP)

(72) Inventors: Takaji Mukohara, Toyota (JP); Yusuke Yamazaki, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 354 days.

(21) Appl. No.: 17/995,380

(22) PCT Filed: Apr. 6, 2020

(86) PCT No.: PCT/JP2020/015545
§ 371 (c)(1),
(2) Date: Oct. 3, 2022

(87) PCT Pub. No.: WO2021/205514
PCT Pub. Date: Oct. 14, 2021

(65) Prior Publication Data
US 2023/0171934 A1 Jun. 1, 2023

(51) Int. Cl.
*H05K 13/04* (2006.01)
(52) U.S. Cl.
CPC .............. *H05K 13/0419* (2018.08)
(58) Field of Classification Search
CPC ................................ H05K 13/0419
See application file for complete search history.

(56) References Cited

U.S. PATENT DOCUMENTS

| | | | | |
|---|---|---|---|---|
| 2015/0195964 | A1* | 7/2015 | Yamasaki | H05K 13/0419 226/76 |
| 2016/0029521 | A1* | 1/2016 | Mori | H05K 13/081 29/714 |
| 2016/0194171 | A1* | 7/2016 | Matsumori | H05K 13/0813 226/91 |
| 2019/0200492 | A1* | 6/2019 | Kitani | B65H 20/22 |

FOREIGN PATENT DOCUMENTS

| | | |
|---|---|---|
| JP | 2019-083263 A | 5/2019 |
| JP | 2019-117820 A | 7/2019 |
| WO | WO 2016/157515 A1 | 10/2016 |

OTHER PUBLICATIONS

International Search Report issued Jun. 30, 2020 in PCT/JP2020/015545 filed on Apr. 6, 2020, 2 pages.

* cited by examiner

*Primary Examiner* — Glenn F Myers
(74) *Attorney, Agent, or Firm* — Oblon, McClelland, Maier & Neustadt, L.L.P.

(57) ABSTRACT

A tape feeder includes a path through which a taped lead component, in which a lead component is taped, is fed-out to a supply position, a sensor disposed in the path to detect the taped lead component, and a notification device configured to notify of detection of the taped lead component when the taped lead component is detected by the sensor.

4 Claims, 8 Drawing Sheets

TAPE FEEDER

TECHNICAL FIELD

The present disclosure relates to a tape feeder for supplying a component using a taped lead component in which a lead component is taped.

BACKGROUND ART

As described in the following Patent Literature, some tape feeders use a taped component in which a component is taped to supply the component.

PATENT LITERATURE

Patent Literature 1: WO 2016/157515

BRIEF SUMMARY

Technical Problem

An object of the present disclosure is to appropriately supply a component using a taped component in which the component is taped, particularly a taped lead component in which a lead component is taped.

Solution to Problem

In order to solve the above-mentioned problems, according to the present specification, there is provided a tape feeder including: a path through which a taped lead component, in which a lead component is taped, is fed-out to a supply position; a sensor disposed in the path to detect the taped lead component; and a notification device configured to notify of detection of the taped lead component when the taped lead component is detected by the sensor.

Advantageous Effects

According to the present disclosure, a sensor is disposed in a path through which a taped lead component is fed-out to a supply position, and when the taped lead component is detected by the sensor, detection of the taped lead component is notified. As a result, by recognizing a position of the taped lead component in the path, it is possible to appropriately supply the component using the taped lead component.

DESCRIPTION OF EMBODIMENTS

Hereinafter, as exemplary embodiments of the present disclosure, examples will be described in detail with reference to drawings.

Figure 1:
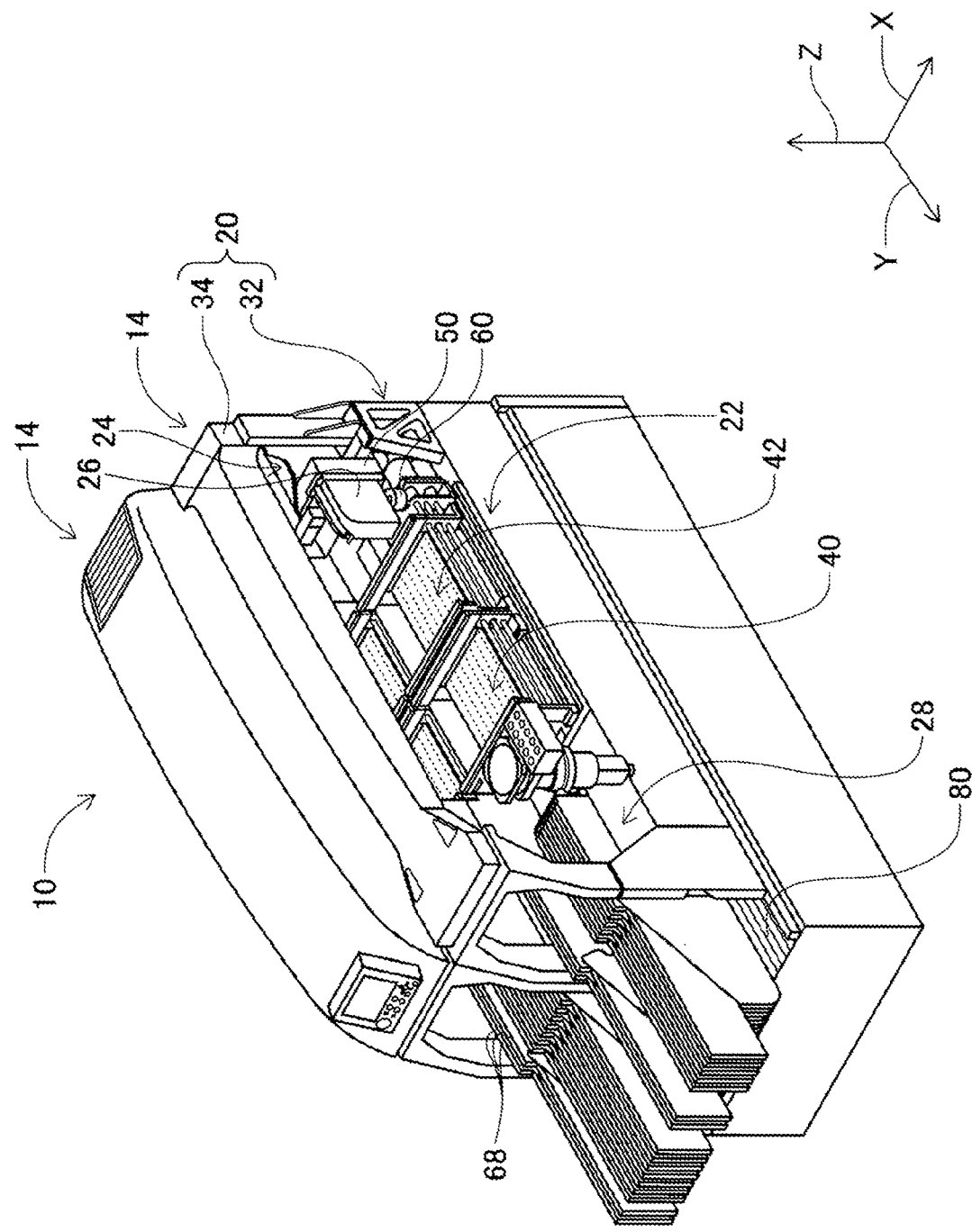
FIG. 1 is a perspective view illustrating an electronic component mounting device.

FIG. 1 illustrates electronic component mounting device 10. Electronic component mounting device 10 includes two electronic component mounters (hereinafter, sometimes abbreviated as "mounter") 14. Each mounter 14 mainly includes mounter main body 20, conveyance device 22, moving device 24, mounting head 26, and supply device 28.

Mounter main body 20 includes frame 32 and beam 34 that is suspended on frame 32. Conveyance device 22 includes two conveyor devices 40 and 42. Each of two conveyor devices 40 and 42 conveys a circuit board supported by each of conveyor devices 40 and 42. In the following description, a conveyance direction of the circuit board is referred to as an X-direction, a horizontal direction perpendicular to the X-direction is referred to as a Y-direction, and a vertical direction perpendicular to the X-direction is referred to as a Z-direction.

Moving device 24 is an XY-robot type moving device and moves slider 50 to any position. When mounting head 26 is attached to slider 50, mounting head 26 is moved to any position on frame 32. Mounting head 26 has suction nozzle 60 provided on a lower end surface. Suction nozzle 60 picks up and holds an electronic component by negative pressure and separates the held electronic component by positive pressure.

Mounting head 26 mounts the electronic component to the circuit board. Suction nozzle 60 is provided on the lower end surface of mounting head 26. Suction nozzle 60 communicates with positive and negative pressure supply device (not illustrated) via positive pressure air and negative pressure air passages. Thus, suction nozzle 60 picks up and holds the electronic component by negative pressure and separates the held electronic component by positive pressure. Mounting head 26 has a nozzle lifting and lowering device (not illustrated) for lifting and lowering suction nozzle 60 and changes a position of the electronic component to be held in an up-down direction.

Figure 2:
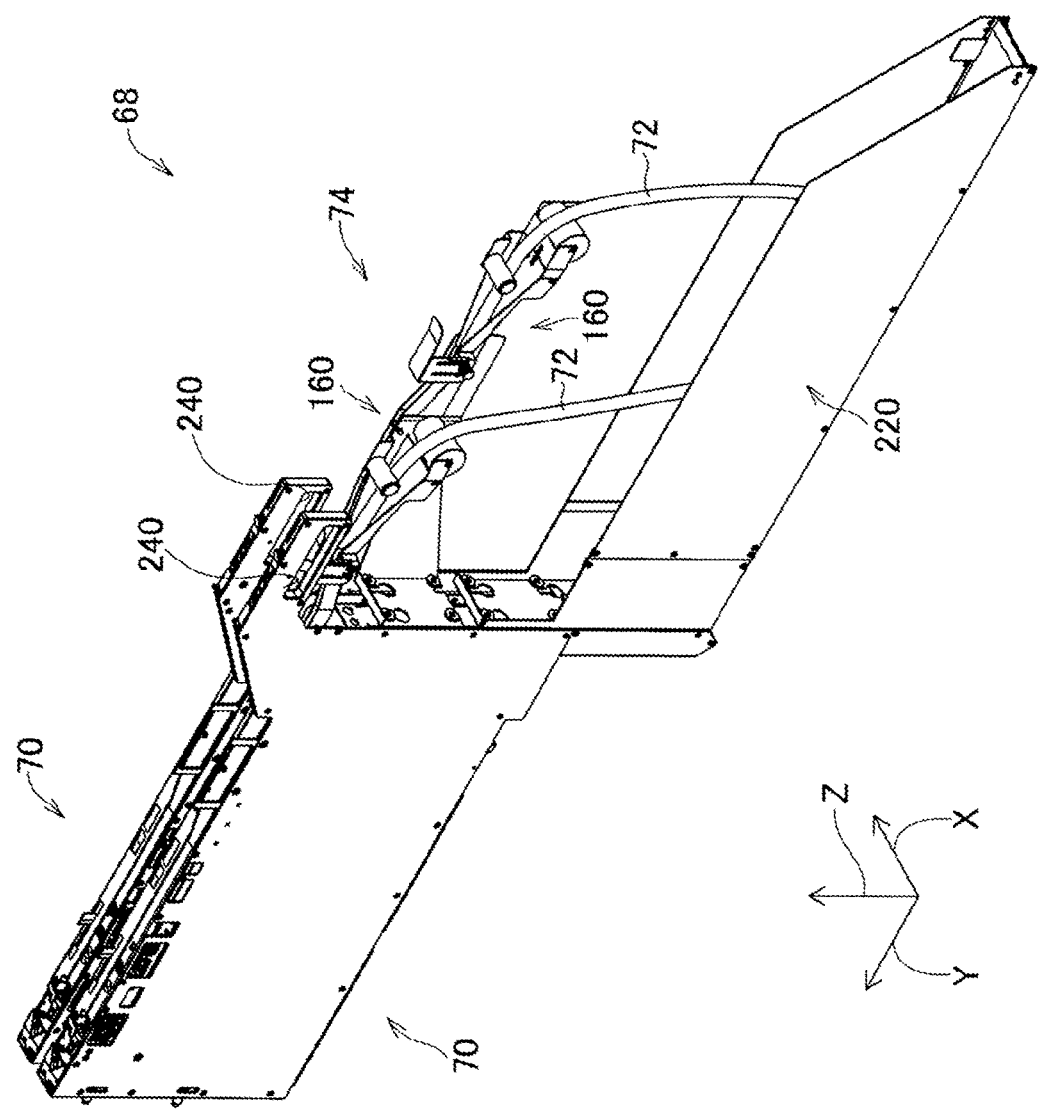
FIG. 2 is a perspective view of a tape feeder.
Figure 3:
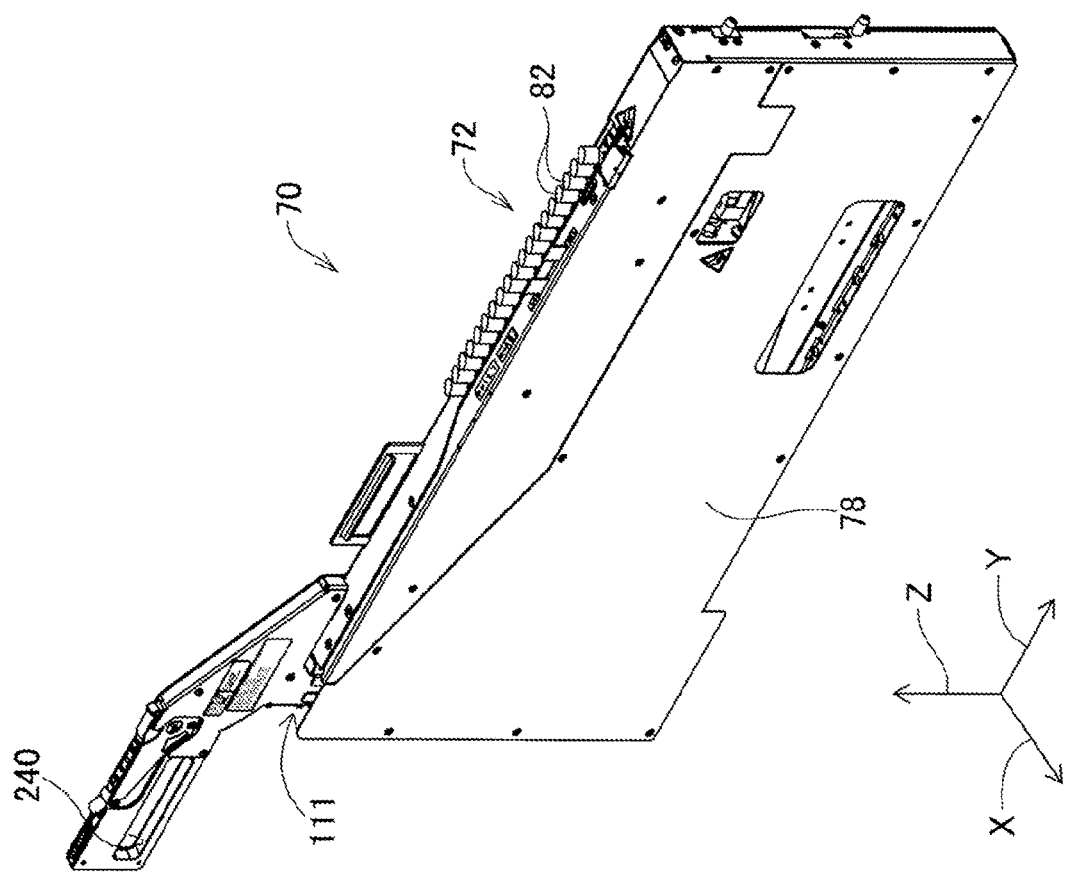
FIG. 3 is a perspective view of a feeder main body.

Supply device 28 includes multiple tape feeders 68. As illustrated in FIG. 2, each of multiple tape feeders 68 includes two feeder main bodies 70, and guide unit 74 for guiding taped component 72 into each of two feeder main bodies 70. As illustrated in FIG. 3, feeder main body 70 includes main body case 78, and is detachably positioned and disposed in main body case 78 by one touch on mounting base 80 (refer to FIG. 1) provided at an end portion of frame 32 of electronic component mounting device 10. Feeder main body 70 is a device for removing radial lead component 82 from taped component 72 and supplying removed radial lead component 82.

Figure 4:
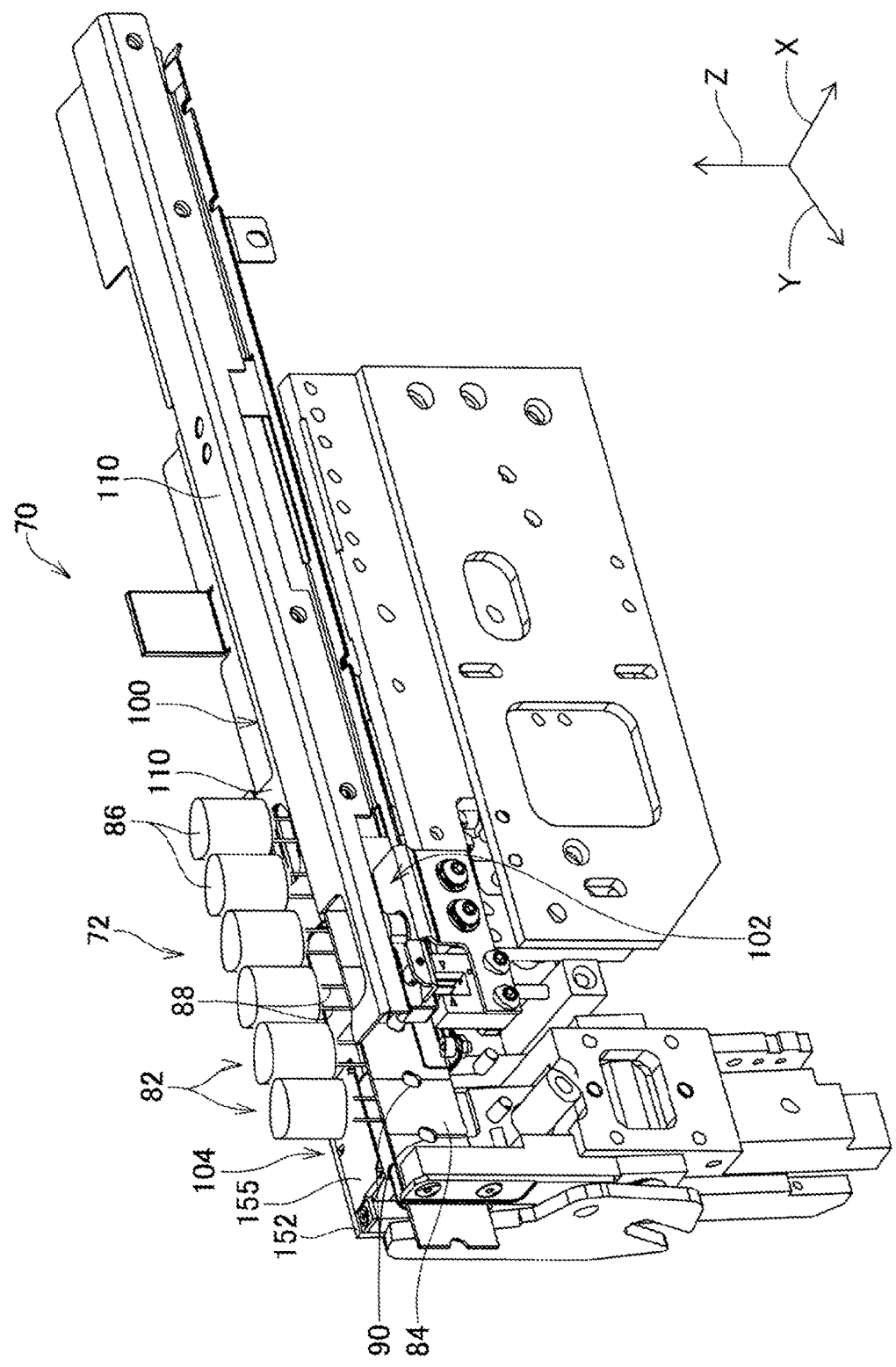
FIG. 4 is an enlarged perspective view of the feeder main body.

Taped component 72 includes multiple radial lead components 82 and carrier tape 84, as illustrated in FIG. 4. Radial lead component 82 includes generally cylindrical main body 86 and two leads 88 extending in the same direction from a bottom surface of main body 86. Two leads 88 of radial lead component 82 are then taped to carrier tape 84 at the lower end portions of leads 88. Further, multiple feeding holes 90 are formed at a uniform pitch in carrier tape 84. Multiple radial lead components 82 are taped to carrier tape 84 at the same pitch as the formation pitch of feeding holes 90.

In addition, feeder main body 70 has conveyance path 100, feed-out device 102, and lead cutting device 104, and conveyance path 100, feed-out device 102, and lead cutting device 104 are disposed inside main body case 78. In the following description, a side on which lead cutting device 104 is disposed is sometimes referred to as a front side, and a side opposite to the front side is sometimes referred to as a rear side.

Conveyance path 100 is partitioned by the pair of guide rails 110. The pair of guide rails 110 is disposed so as to extend in a front-rear direction in a state of facing an upper end face of main body case 78, and a space between facing side surfaces of the pair of guide rails 110 is defined as conveyance path 100. Then, carrier tape 84 of taped component 72 is inserted between the facing side surfaces of the pair of guide rails 110, that is, conveyance path 100, in a state in which a width direction of carrier tape 84 extends in the up-down direction, that is, in an erected state. The state in which carrier tape 84 is erected is a state in which carrier tape 84 and an upper surface of feeder main body 70 intersect at a substantially right angle, and is a state in which lead 88 taped by carrier tape 84 extends in the up-down direction. Radial lead components 82 held in carrier tape 84 then extend upward from between the pair of guide rails 110. Conveyance path 100 has opening 111 (refer to FIG. 3) at a rear end of feeder main body 70, and taped component 72 is inserted into conveyance path 100 through opening 111.

Figure 5:
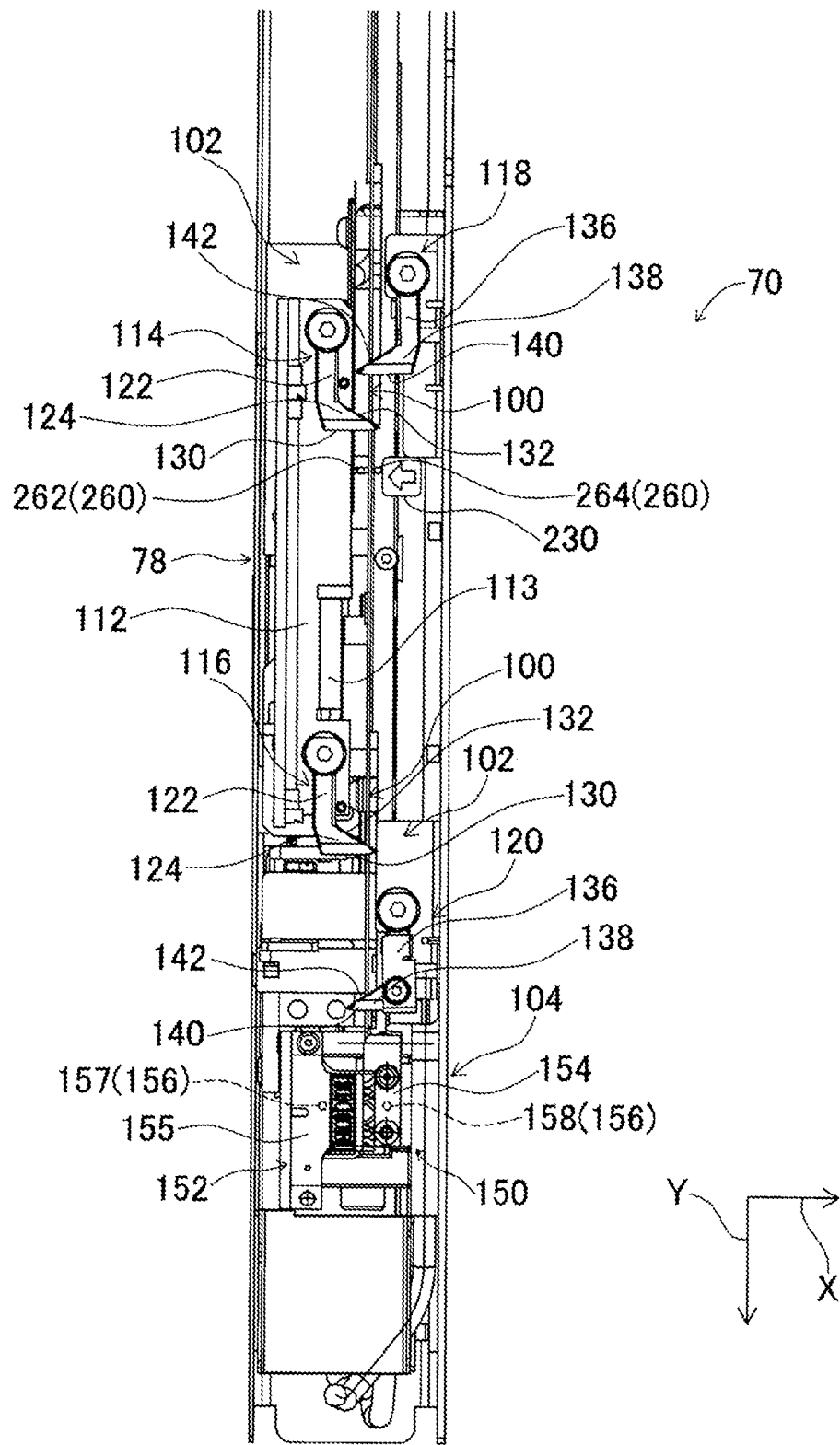
FIG. 5 is a plan view illustrating the feeder main body as viewed from above.

As illustrated in FIG. 5, feed-out device 102 includes slider 112, first feed-out claw member 114, second feed-out claw member 116, first return preventing claw member 118, and second return preventing claw member 120. It should be noted that FIG. 5 is a view illustrating main body case 78 in a state in which guide rail 110 is removed from above.

Slider 112 is disposed so as to extend in the front-rear direction at an upper end portion of main body case 78, and is slidably held in the front-rear direction by main body case 78. Slider 112 controllably slides by driving of air cylinder 113. First feed-out claw member 114 and second feed-out claw member 116 have the same shape and are generally L-shaped. Each of first feed-out claw member 114 and second feed-out claw member 116 is configured by main body 122 and bent portion 124 bent at about 90 degrees with respect to main body 122. First feed-out claw member 114 and second feed-out claw member 116 are disposed on slider 112 in a posture in which main body 122 is extended in the front-rear direction and bent portion 124 is directed toward the front side. It should be noted that first feed-out claw member 114 and second feed-out claw member 116 are arranged in slider 112 in the front-rear direction, and distal ends of bent portions 124 of first feed-out claw member 114 and second feed-out claw member 116 are oriented in the same direction and enter the inside of conveyance path 100. Incidentally, second feed-out claw member 116 is disposed on a front side of first feed-out claw member 114. That is, second feed-out claw member 116 is disposed on the front side, and first feed-out claw member 114 is disposed on the rear side. It should be noted that an installation pitch between first feed-out claw member 114 and second feed-out claw member 116 is an integer multiple of a pitch at which feeding holes 90 of taped component 72 are formed.

In addition, first feed-out claw member 114 and second feed-out claw member 116 are pivotably held by slider 112 at an end portion on the rear side of main body 122 in a right-left direction (in a direction in which bent portion 124 enters and exits the inside of conveyance path 100). First feed-out claw member 114 and second feed-out claw member 116 are biased in a direction in which bent portion 124 enters the inside of conveyance path 100 by a compression coil spring (not illustrated). It should be noted that a front surface of bent portion 124 is a surface perpendicular to main body 122, but a rear surface of bent portion 124 is a tapered surface that is directed toward the rear as it approaches main body 122. Therefore, the front surface of bent portion 124 is referred to as perpendicular surface 130, and the rear surface of bent portion 124 is referred to as tapered surface 132. In the following description, first feed-out claw member 114 and second feed-out claw member 116 may be collectively referred to as feed-out claw members 114 and 116.

First return preventing claw member 118 and second return preventing claw member 120 have substantially the same shapes as feed-out claw members 114 and 116, and include main body 136 and bent portion 138, similarly to feed-out claw members 114 and 116. First return preventing claw member 118 and second return preventing claw member 120 are disposed on the upper surface of main body case 78 in a posture in which main body 136 is extended in the front-rear direction and bent portion 138 is oriented toward the front side. It should be noted that first return preventing claw member 118 and second return preventing claw member 120 are arranged so as to be aligned in the front-rear direction on sides opposite to feed-out claw members 114 and 116 with conveyance path 100 therebetween. The distal ends of bent portions 138 of first return preventing claw member 118 and second return preventing claw member 120 are oriented in the same direction and enter the inside of conveyance path 100.

In addition, second return preventing claw member 120 is disposed at a fixed position on the front side of first return preventing claw member 118, and is disposed on the front side of second feed-out claw member 116. That is, second return preventing claw member 120 is disposed on the side opposite to the second feed-out claw member 116 with conveyance path 100 therebetween on the front side of second feed-out claw member 116. In addition, first return preventing claw member 118 is disposed at a fixed position slightly behind first feed-out claw member 114 so as to face first feed-out claw member 114 with conveyance path 100 therebetween. It should be noted that the installation pitch between first feed-out claw member 114 and first return preventing claw member 118 is an integer multiple of the formation pitch of feeding hole 90 of taped component 72, and the installation pitch between second feed-out claw member 116 and second return preventing claw member 120 is also an integer multiple of the formation pitch of feeding hole 90 of taped component 72.

In addition, first return preventing claw member 118 and second return preventing claw member 120 are pivotably held at an end portion on the rear side of main body 136 in the right-left direction (in direction in which bent portion 138 enters and exits the inside of conveyance path 100) from the viewpoint of an upper surface direction of main body case 78. First return preventing claw member 118 and second return preventing claw member 120 are biased in the direction in which the bent portion enters the inside of conveyance path 100 by a compression coil spring (not illustrated). In addition, in first return preventing claw member 118 and second return preventing claw member 120, similarly to first feed-out claw member 114 and second feed-out claw member 116, the front surface of bent portion 138 is referred to as perpendicular surface 140, and the rear surface of bent portion 138 is referred to as tapered surface 142. In the following description, first return preventing claw member 118 and second return preventing claw member 120 may be collectively referred to as return preventing claw members 118 and 120.

According to such a configuration, in feed-out device 102, slider 112 slides in the front-rear direction, and thus, taped component 72 is fed-out toward the front side. Specifically, bent portion 124 entering the conveyance path of feed-out claw members 114 and 116 disposed in slider 112 engages with feeding hole 90 of taped component 72 inserted in the conveyance path. When slider 112 linearly slides toward the front side by the driving of air cylinder 113, feed-out claw members 114 and 116 disposed on slider 112 also slide toward the front side together with slider 112. It should be noted that a sliding amount of slider 112 is an amount corresponding to an integer multiple of the forming pitch of feeding holes 90 of taped component 72. At this time, in taped component 72, perpendicular surface 130 of bent portion 124 engaged with feeding hole 90 pushes the feeding hole toward the front side, and thus, the amount of the pitch of the feeding hole is fed. Since perpendicular surface 130 is perpendicular to taped component 72, the force pushed toward the front side by perpendicular surface 130 is transmitted to taped component 72, and thus, taped component 72 is fed-out toward the front side.

It should be noted that although bent portion 138 of return preventing claw members 118 and 120 also engages with feeding hole 90 of taped component 72 inserted into conveyance path 100 in conveyance path 100, the engagement of return preventing claw members 118 and 120 is canceled when taped component 72 is fed-out. That is, when taped component 72 is fed-out toward the front side, bent portion 138 of return preventing claw members 118 and 120 engaged with feeding hole 90 is pushed toward the front side by the edge portion defining feeding hole 90 on tapered surface 142. Tapered surface 142 is not perpendicular to taped component 72, and is inclined toward the rear side as it approaches a proximal end portion of bent portion 138, that is, main body 136. Therefore, the force for pushing tapered surface 142 toward the front side is converted into a force in a direction for separating bent portion 138 from taped component 72, and thus, return preventing claw members 118 and 120 pivot in a direction for separating taped component 72 from each other. As a result, when taped component 72 is fed-out to the front side by the amount by which the slide slides toward the front side, the engagement of return preventing claw members 118 and 120 with the feeding hole of taped component 72 is canceled, and the taped component is fed in the canceled state. Then, when the feeding-out of the sliding amount of the taped component in the front direction is completed, each return preventing claw member reengages with the feeding hole of the taped component.

After the feeding-out of taped component 72 to the front side is completed, slider 112 slides linearly toward the rear side by the same distance as the sliding amount when the taped component is fed to the front side by the driving of air cylinder 113, and thus, feed-out claw members 114 and 116 attached to slider 112 also slide to the rear side. At this time, return preventing claw members 118 and 120 prevent taped component 72 from returning in a direction opposite to a feeding-out direction, and the engagement of feed-out claw members 114 and 116 with feeding hole 90 is canceled.

That is, when feed-out claw members 114 and 116 slide rearward, bent portion 124 of each of feed-out claw members 114 and 116 engaged with feeding hole 90 of the taped component pushes an edge portion defining feeding hole 90 toward the rear side on tapered surface 132. Therefore, a force for returning in a direction opposite to the feeding-out direction is transmitted to taped component 72. However, when each feed-out claw member slides rearward, bent portion 138 of each of return preventing claw members 118 and 120 engages with feeding hole 90 of taped component 72, and perpendicular surface 140 of bent portion 138 is pushed toward the rear side by the edge portion defining feeding hole 90. Since perpendicular surface 140 of the return preventing claw member engaged with the feeding hole of taped component 72 is at an angle perpendicular to the longitudinal direction of taped component 72 inserted in the conveyance path, the force for pushing perpendicular surface 140 is not dispersed in the right-left direction, and thus, return preventing claw members 118 and 120 do not pivot. Therefore, the engagement of return preventing claw members 118 and 120 with feeding hole 90 is maintained, and thus, the movement of taped component 72 in the direction opposite to the feeding-out direction when each feed-out claw member slides rearward is prevented.

In addition, tapered surface 132 of bent portion 124 of each of feed-out claw members 114 and 116 is inclined toward the rear side as it approaches main body 122. Therefore, when feed-out claw members 114 and 116 engaged with the tape feeding hole of the taped component inserted in the conveyance path slide rearward, a reaction force of the force by which tapered surface 132 presses the edge portion defining feeding hole 90 is also converted in the direction that separates bent portion 124 from taped component 72. This force causes feed-out claw members 114 and 116 to pivot in a direction away from taped component 72, and thus, the engagement of feed-out claw members 114 and 116 with taped component 72 is canceled. Then, feed-out claw members 114 and 116 slide rearward, return to the position before the feeding-out of taped component 72, and reengage with feeding hole 90 of taped component 72 after the feeding-out to the front side.

With these configurations, feed-out claw members 114 and 116 return to the positions before taped component 72 is fed-out while preventing taped component 72 from moving in the direction opposite to the feeding-out direction. Then, air cylinder 113 is operated again to slide slider 112 and the feed-out claw member engaged with the feeding hole of the taped component forward, and thus, taped component 72 is fed-out toward the front side. As described above, each time slider 112 sequentially slides in the front-rear direction by the operation of air cylinder 113, taped component 72 is fed-out by an amount corresponding to the forming pitch of feeding holes 90, that is, the installation pitch of radial lead components 82.

In addition, lead cutting device 104 is disposed in a direction in which taped component 72 is fed-out by feed-out device 102, and ahead of feed-out device 102. Lead cutting device 104 includes fixing member 150 and pivot member 152. Fixing member 150 and pivot member 152 are disposed at positions on the front side of feed-out device 102 so as to sandwich carrier tape 84 of taped component 72 fed-out by feed-out device 102. Fixing member 150 is fixedly disposed in a posture extending in the up-down direction, and fixed-side cutter 154 is disposed on an upper surface of the fixing member. In addition, pivot member 152 is disposed in a posture extending in the up-down direction at a position facing fixing member 150 with carrier tape 84 therebetween, and pivot-side cutter 155 is disposed on an upper surface of pivot member 152.

In addition, pivot member 152 is pivotable so as to move an upper end thereof closer to and away from fixing member 150. When pivot member 152 pivots so that the upper end thereof approaches fixing member 150, lead 88 located between pivot member 152 and fixing member 150 is cut by pivot-side cutter 155 and fixed-side cutter 154. At this time, radial lead component 82 is separated from carrier tape 84, and lead 88 of separated radial lead component 82 is sandwiched by pivot member 152 and fixing member 150. As a result, in feeder main body 70, radial lead component 82 is supplied in a state in which lead 88 is sandwiched by pivot member 152 and fixing member 150. That is, in feeder main body 70, the upper end of lead cutting device 104 is located at the component supply position. In addition, return preventing claw member 120 located on the most downstream side of the claw member of feed-out device 102, that is, return preventing claw member 120 located at the position closest to the supply position is disposed behind lead cutting device 104, that is, on the upstream side. Therefore, taped component 72 at the supply position and feed-out device 102 are not engaged with each other, and taped component 72 at the supply position is pushed out and fed-out to the feed-out device from the rear side.

It should be noted that detection sensor 156 for detecting taped component 72 is disposed at a component supply position, that is, a position at which lead 88 of taped component 72 is cut by fixing member 150 and pivot member 152. Detection sensor 156 is a transmissive optical sensor and is configured by light projecting section 157 and light receiving section 158. Light projecting section 157 and light receiving section 158 are disposed so as to face each other with conveyance path 100 therebetween. Therefore, in a case where taped component 72 is not provided in conveyance path 100, light emitted from light projecting section 157 is received by light receiving section 158. Meanwhile, in a case where taped component 72 is present in conveyance path 100, the light emitted from light projecting section 157 is obstructed by taped component 72, and thus, the presence of taped component 72 between light projecting section 157 and light receiving section 158 is detected by detection sensor 156. As a result, detection sensor 156 can detect whether taped component 72 is present at the supply position, that is, whether taped component 72 is fed-out to the supply position.

Figure 6:
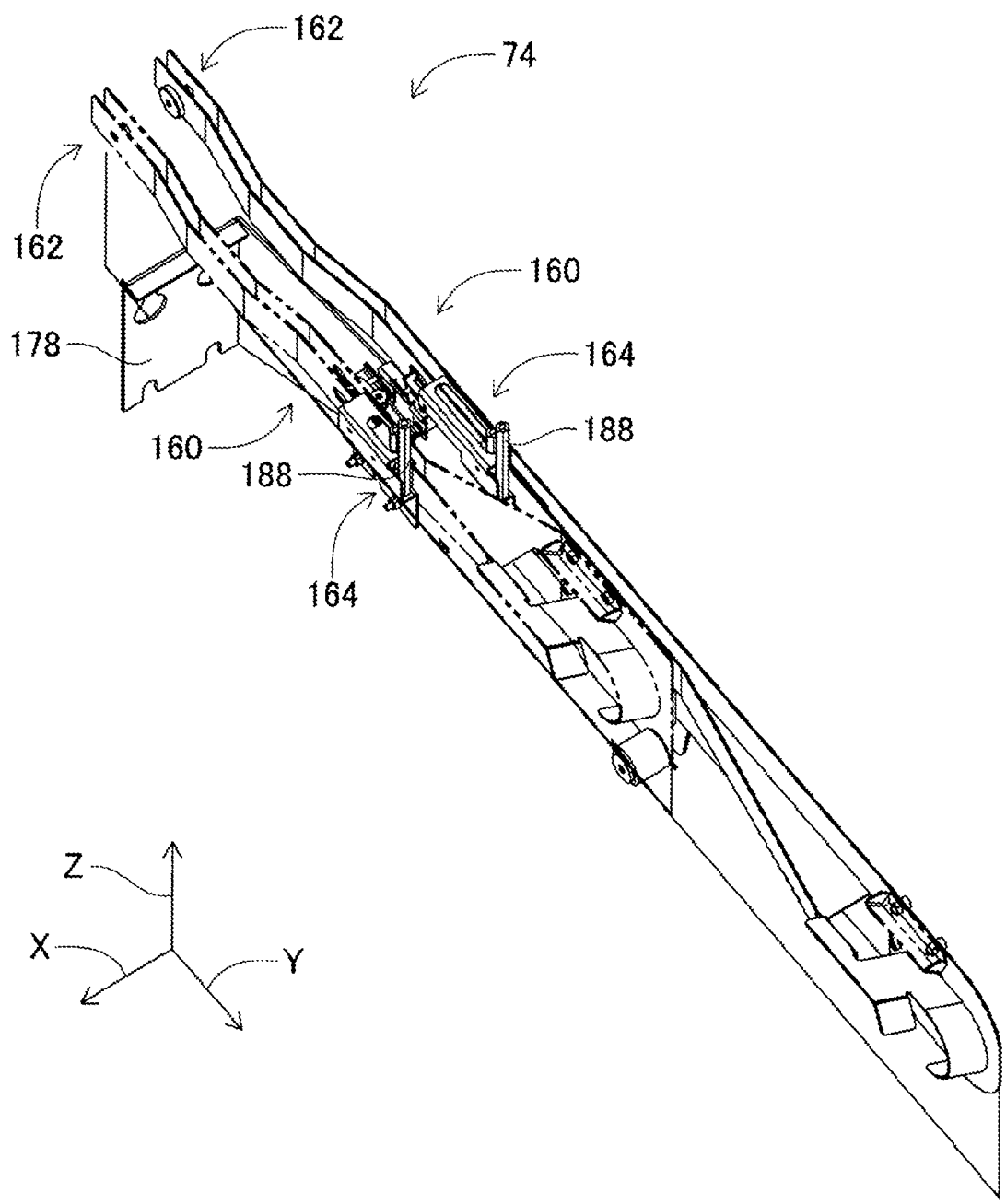
FIG. 6 is a perspective view of a guide unit.

As illustrated in FIG. 6, guide unit 74 has a configuration including two guide mechanisms 160, and two guide mechanisms 160 are disposed to be arranged in the X-direction in a posture extending in the Y-direction. One guide mechanism 160 corresponds to one feeder main body 70, and is a unit for guiding taped component 72 supplied to corresponding feeder main body 70. That is, one guide unit 74 is fixedly positioned and coupled to the rear end portions of two feeder main bodies 70 by one touch without using a tool by an operator. It should be noted that the side of guide unit 74 coupled to feeder main body 70 is referred to as a front side, and the side opposite to the front side is referred to as a rear side.

Figure 7:
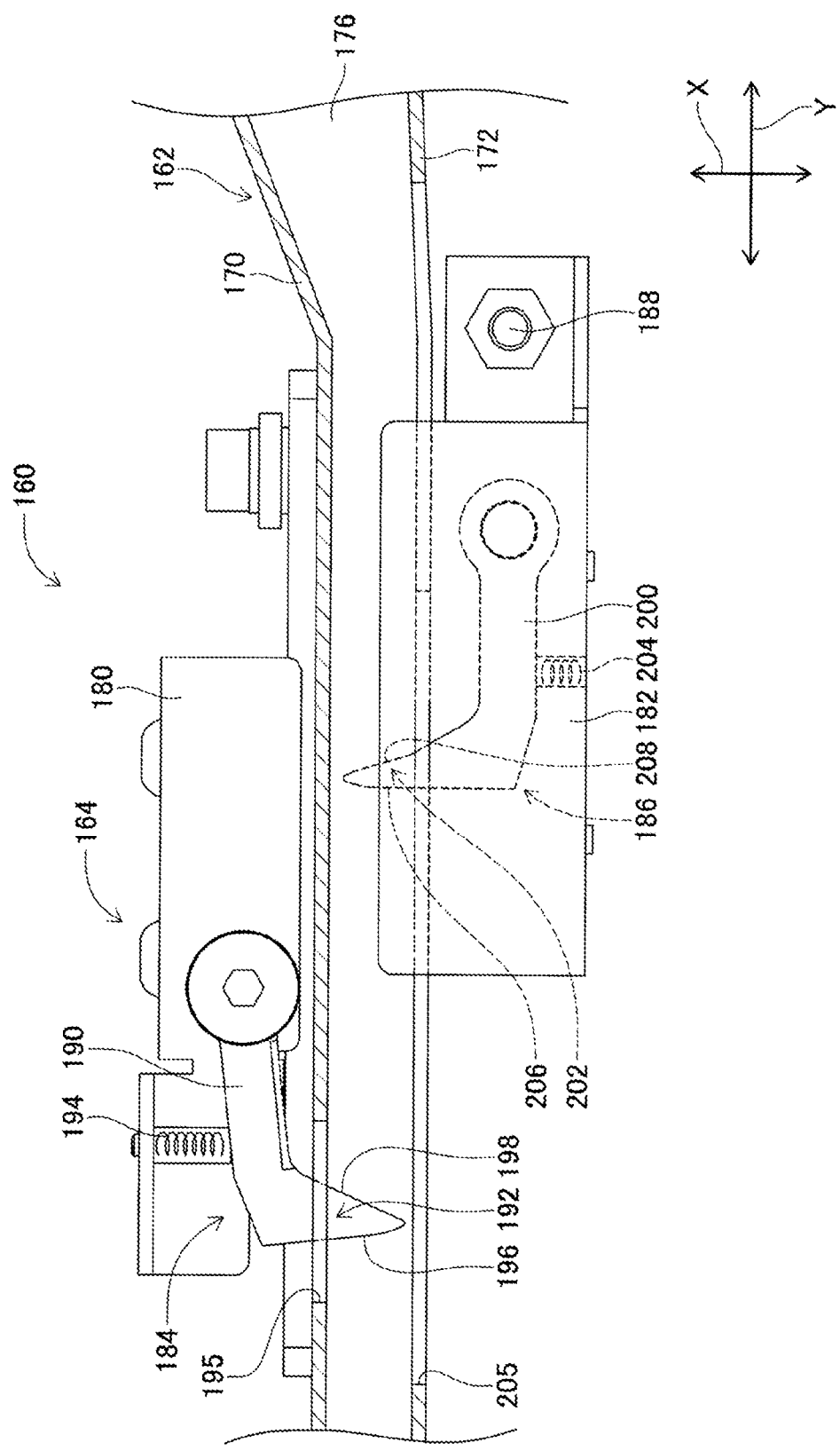
FIG. 7 is an enlarged view of a guide mechanism.

As illustrated in FIG. 7, each guide mechanism 160 includes guide frame 162 and feed-out mechanism 164. Guide frame 162 includes the pair of side walls 170 and 172 and bottom plate 176. The pair of side walls 170 and 172 faces each other in a standing state with a predetermined dimension (about several millimeters for guiding the carrier tape of the taped component and the lead adhered to the carrier tape), and is disposed in a posture extending in the Y-direction. A space between the pair of side walls 170 and 172 is closed by bottom plate 176 at a lower end portion.

As illustrated in FIG. 6, guide frames 162 of two guide mechanisms 160 are integrated by brackets 178 at their front end portions. Then, in bracket 178, in a connection round-bellied hole of bolts at the rear end portions of two feeder main bodies 70, positioning groove is fitted into a positioning pin, the fitted bolts are tightened, and thus, guide unit 74 is coupled to the rear end portions of two feeder main bodies 70. In addition, when guide unit 74 is positioned and coupled to the rear end portions of two feeder main bodies 70, a distal end portion of guide frame 162 of guide mechanism 160 faces opening 111 at the rear end of feeder main body 70 corresponding to guide mechanism 160.

As illustrated in FIG. 7, feed-out mechanism 164 includes fixing bracket 180, slide bracket 182, return preventing claw member 184, and feed-out claw member 186. Fixing bracket 180 is fixed to one side wall 170 of the pair of side walls 170 and 172 in a posture extending in the Y-direction. Meanwhile, slide bracket 182 is slidably disposed in the Y-direction in a posture extending in the Y-direction on other side wall 172 of the pair of side walls 170 and 172. Feed-out handle 188 extending upward is fixed to a rear end portion of slide bracket 182, and slide bracket 182 slides linearly along side wall 172 by an operator moving feed-out handle 188 in the front-rear direction. It should be noted that slide bracket 182 slides in a range in which a front side is set as a front end from a position facing fixing bracket 180, and a rear side is set as a rear end from a position facing fixing bracket 180.

In addition, return preventing claw member 184 is generally L-shaped, and includes main body 190 and bent portion 192 bent at about 90 degrees with respect to main body 190. Return preventing claw member 184 is disposed in fixing bracket 180 in a posture in which main body 190 is extended in the front-rear direction and bent portion 192 is directed toward the front side. It should be noted that the distal end of bent portion 192 of return preventing claw member 184 faces side wall 170.

In addition, return preventing claw member 184 is pivotably held in the right-left direction (in direction in which bent portion 192 enters and exits the inside of guide frame 162) by fixing bracket 180 at an end portion on the rear side of main body 190, and is biased in the direction approaching side wall 170 by compression coil spring 194. Slit 195 is formed in side wall 170 at a position facing bent portion 192 of return preventing claw member 184, and bent portion 192 of return preventing claw member 184 biased by compression coil spring 194 enters the inside of guide frame 162, that is, between the pair of side walls 170 and 172, via slit 195.

It should be noted that a front surface of bent portion 192 of return preventing claw member 184 entering the inside of guide frame 162 is a surface perpendicular to main body 190, but a rear surface of bent portion 192 is a tapered surface toward the rear side as it approaches main body 190. Therefore, the front surface of bent portion 192 is referred to as perpendicular surface 196, and the rear surface of bent portion 192 is referred to as tapered surface 198.

In addition, feed-out claw member 186 has substantially the same shape as return preventing claw member 184, and is configured by main body 200 and bent portion 202 in the same manner as return preventing claw member 184. Feed-out claw member 186 is disposed in slide bracket 182 in a posture in which main body 200 is extended in the front-rear direction and bent portion 202 is oriented toward the front side. It should be noted that the distal end of bent portion 202 of feed-out claw member 186 faces side wall 172. In addition, feed-out claw member 186 is disposed on the rear side of return preventing claw member 184, and the installation pitch between feed-out claw member 186 and return preventing claw member 184 is made the same as the pitch of feeding holes 90 formed in taped component 72.

In addition, feed-out claw member 186 is pivotably attached to slide bracket 182 at an end portion on the rear side of main body 200 in the right-left direction (in direction in which bent portion 202 enters and exits the inside of guide frame 162), and is biased by compression coil spring 204 in the direction toward side wall 172. Slit 205 is formed in side wall 172 at a position facing bent portion 202 of feed-out claw member 186, and thus, bent portion 202 of feed-out claw member 186 biased by compression coil spring 204 enters the inside of guide frame 162 through slit 205.

It should be noted that a surface on a front side of bent portion 202 of feed-out claw member 186 entering the inside of guide frame 162 is a surface perpendicular to main body 200, but a surface of a rear side of bent portion 202 is a tapered surface that is directed toward the rear side as it approaches main body 200. Therefore, the front surface of bent portion 202 is referred to as perpendicular surface 206, and the rear surface of bent portion 202 is referred to as tapered surface 208.

As illustrated in FIG. 2, stocker 220 is disposed below guide unit 74. Stocker 220 has a box shape having a generally elongated shape and an upper surface thereof is opened. Two taped components 72 are housed in the inside of stocker 220 in a folded state, one end of each of taped components 72 is pulled out from one stocker 220, and the one end is inserted into the inside of guide frame 162 of each guide mechanism 160, that is, between the pair of side walls 170 and 172. Between the pair of side walls 170 and 172, carrier tape 84 of taped component 72 is accommodated in an erected posture. Radial lead component 82 taped by accommodated carrier tape 84 extends upward from the upper ends of side walls 170 and 172. It should be noted that the state in which taped component 72 is erected is a state in which carrier tape 84 is erected in a direction orthogonal to bottom plate 176 of guide frame 162, and lead 88 taped by carrier tape 84 is in a state in which it extends in the up-down direction. In addition, feed-out claw member 186 and return preventing claw member 184 engage with feeding hole 90 of taped component 72 accommodated between the pair of side walls 170 and 172. Then, by the operator holding feed-out handle 188 and causing feed-out claw member 186 to slide in the front-rear direction, taped component 72 accommodated between the pair of side walls is fed-out toward the inside of feeder main body 70 and is set in feeder main body 70.

Specifically, the distal end of bent portion 202 of feed-out claw member 186 engages with feeding hole 90 of carrier tape 84 of taped component 72 inserted between the pair of side walls 170 and 172 via slit 205. In addition, the distal end of bent portion 192 of return preventing claw member 184 engages with feeding hole 90 located on the front side of feeding hole 90 with which feed-out claw member 186 is engaged via slit 195. In other words, feed-out claw member 186 and return preventing claw member 184 engage with two feeding holes 90 of taped component 72.

Then, when the operator slides feed-out handle 188 forward in a state in which feed-out claw member 186 and return preventing claw member 184 are engaged with two feeding holes 90 of taped component 72, slide bracket 182 slides linearly toward the front side. Accordingly, feed-out claw member 186 disposed in slide bracket 182 also slides linearly toward the front side, and thus, taped component 72 is pushed toward the front side by perpendicular surface 196 of bent portion 192 of feed-out claw member 186. Since perpendicular surface 196 is perpendicular to the longitudinal direction of taped component 72 accommodated in the pair of side walls, taped component 72 is fed-out toward the front side by the force pushed toward the front side by perpendicular surface 196 acting on taped component 72.

Although return preventing claw member 184 is also engaged with feeding hole 90 of taped component 72 fed-out toward the front side by the sliding of feed-out claw member 186, the engagement of return preventing claw member 184 is canceled when taped component 72 is fed-out by the feed-out claw member. Specifically, when taped component 72 is fed-out by the feed-out claw member, tapered surface 19 of bent portion 192 of return preventing claw member 184 engaged with feeding hole 90 is pushed toward the front side by the edge portion defining engaged feeding hole 90. Tapered surface 198 is not perpendicular to taped component 72 accommodated between the pair of side walls, and is inclined toward the rear side as it approaches the proximal end portion of bent portion 192, that is, main body 190. Accordingly, when taped component moves, the force by which the edge portion defining the engaged feeding hole pushes tapered surface 198 toward the front side acts on the force in the direction that separates bent portion 192 from taped component 72, and thus, return preventing claw member 184 pivots in the direction that separates from taped component 72 against the elastic force of compression coil spring 194. As a result, when taped component 72 is fed-out toward the front side by the sliding of the feed-out claw member 186, the engagement of return preventing claw member 184 with taped component 72 is canceled.

In this manner, when the operator operates feed-out handle 188, slide bracket 182 slides toward the front side, and thus, taped component 72 is fed-out toward the front side inside guide frame 162. Then, slide bracket 182 slides by the distance of the pitch of the feeding hole of the carrier tape, which is the front end of the slidable range, and the feeding-out of taped component 72 is stopped at that position. At this time, next feeding hole 90 of taped component 72 from which the feeding-out is stopped faces the distal end of bent portion 192 of return preventing claw member 184. Therefore, bent portion 192 of return preventing claw member 184 engages with feeding hole 90 of taped component 72 of which the feeding-out is stopped by the elastic force of compression coil spring 194. That is, when the feeding-out of taped component 72 by the sliding of the feed-out claw member 186 by a predetermined distance is completed, feed-out claw member 186 and return preventing claw member 184 are brought into engagement with two feeding holes 90 of taped component 72.

Subsequently, after slide bracket 182 is slid to the front end of the slidable range, the operator operates feed-out handle 188 rearward to linearly slide slide bracket 182 toward the rear side. At this time, taped component 72 is not moved in the direction opposite to the feeding-out direction by return preventing claw member 184, and the engagement of feed-out claw member 186 with feeding hole 90 is canceled.

Specifically, when feed-out claw member 186 slides rearward, tapered surface 208 of bent portion 202 of feed-out claw member 186 engaged with feeding hole 90 of the carrier tape pushes the edge portion defining feeding hole 90 toward the rear side. Therefore, a force for moving taped component 72 in the direction opposite to the feeding-out direction is transmitted to taped component 72.

At this time, bent portion 192 of return preventing claw member 184 engages with feeding hole 90 of carrier tape, and perpendicular surface 196 of bent portion 192 is pushed toward the rear side by the edge portion defining feeding hole 90. However, since perpendicular surface 196 is perpendicular to the feeding direction of taped component 72 accommodated between the pair of side walls, and the force for pushing perpendicular surface 196 is not dispersed in the right-left direction, return preventing claw member 184 does not pivot. Therefore, even when feed-out claw member 186 is slid rearward, the engagement of return preventing claw member 184 with feeding hole 90 of the carrier tape is maintained, and thus, taped component 72 is prevented from moving in the direction opposite to the feeding-out direction.

In addition, tapered surface 208 of bent portion 202 of feed-out claw member 186 is inclined toward the rear as it approaches main body 200. Therefore, when feed-out claw member 186 slides rearward, the force by which tapered surface 208 presses the edge portion defining feeding hole 90 acts in the direction in which bent portion 202 is separated from taped component 72. By this force, feed-out claw member 186 pivots in the direction away from taped component 72, and thus, the engagement of feed-out claw member 186 with feeding hole 90 is canceled. Then, by sliding feed-out claw member 186 by the distance of the pitch of the feeding hole of the carrier tape, which is the rear end of the slidable range, feeding hole 90 of taped component 72 after the feeding-out is reengaged.

In this manner, feed-out claw member 186 is returned to the position before taped component 72 is fed-out while preventing taped component 72 from moving in the direction opposite to the feeding-out direction. Then, feed-out handle 188 is again operated in the front direction in the same manner as the above-described procedure, and thus, taped component 72 is fed-out toward the front side. In this manner, every time feed-out handle 188 is reciprocated and operated in the front-rear direction, taped component 72 is fed-out by an amount that slides in the front direction of slide bracket 182. As a result, the operator can cause taped component 72 to enter the inside of conveyance path 100 from opening 111 of feeder main body 70 and feed out taped component 72 to the inside of feeder main body 70 by operating feed-out handle 188 in the front-rear direction.

Then, when the feeding hole of the carrier tape of fed-out taped component 72 is fed-out to a position where the feeding hole engages first feed-out claw member 114 and first return preventing claw member 118 in conveyance path 100 of feeder main body 70, taped component 72 engaged with first feed-out claw member 114 and first return preventing claw member 118 can be conveyed to the supply position by air cylinder 113 of the feed-out device. Therefore, as illustrated in FIG. 5, arrow mark 230 is formed on an upper end face of feeder main body 70 on a front side of first feed-out claw member 114 and return preventing claw member 118. Arrow mark 230 is a measure of the insertion position of taped component 72 in the conveyance path through which first feed-out claw member 114 and first return preventing claw member 118 are allowed to engage with feeding hole 90 of taped component 72, and arrow mark 230 is written at a position of a slight distance to the front side from the position of the front end of bent portion 124 provided in first feed-out claw member 114 that is positioned and stopped before taped component is fed to the supply position, for example, at least about one pitch of the feeding holes formed in the carrier tape. Then, with arrow mark 230 as a marker, the operator operates feed-out handle 188 of guide unit 74. That is, when the operator operates feed-out handle 188 to feed-out taped component 72 to the inside of conveyance path 100 of feeder main body 70, the operator continuously operates feed-out handle 188 while visually confirming radial lead component 82 exposed from the upper end portion of conveyance path 100. Then, at a timing when leading radial lead component 82 reaches arrow mark 230, the operator stops the operation of feed-out handle 188. At this time, since taped component 72 is fed-out at least to arrow mark 230 and the carrier tape has passed through first feed-out claw member 114 and return preventing claw member 118, first feed-out claw member 114 and return preventing claw member 118 engage with feeding hole 90 of fed-out taped component 72.

Figure 8:
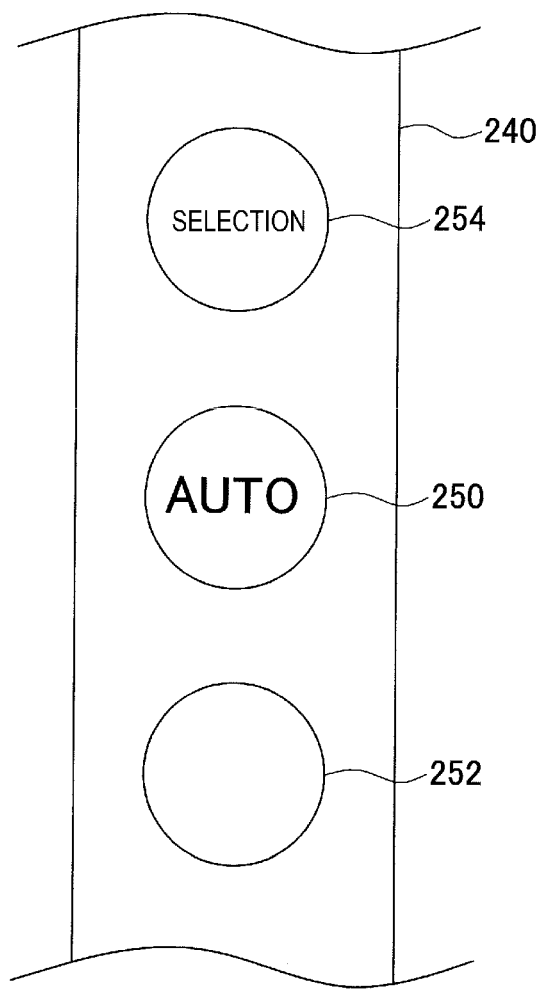
FIG. 8 illustrates a selection button, an AUTO button, and an indicator lamp.

As illustrated in FIGS. 2 and 3, handle 240 for gripping feeder main body 70 is provided at the rear end portion of feeder main body 70, and AUTO button 250 is disposed on an upper surface side of handle 240 as illustrated in FIG. 8. AUTO button 250 is a button for actuating feed-out device 102, and when AUTO button 250 is touched, air cylinder 113 of feed-out device 102 is actuated, and thus, taped component 72 is automatically fed-out to the supply position. That is, when AUTO button 250 is operated, air cylinder 113 is operated, slider 112 and feed-out claw members 114 and 116 disposed on slider 112 slide in the front-rear direction, and taped component 72 is fed-out to the supply position as described above. In addition, detection sensor 156 is disposed at the supply position, and thus, taped component 72 that has arrived at the supply position is detected. When taped component 72 fed-out to the supply position is detected by detection sensor 156, the operation of feed-out device 102 is stopped, and thus, the feeding-out of taped component 72 is stopped. When taped component 72 is detected at the supply position, lead cutting device 104 is operated to supply radial lead component 82 separated from the carrier tape at the supply position.

In this manner, in order to set the taped lead component in the tape feeder, the operator first operates feed-out handle 188 of guide unit 74, and feeds-out taped component 72 to arrow mark 230 while visually confirming taped component 72 of conveyance path 100. Then, after confirming that the taped component has reached the arrow mark of the conveyance path, the operator operates AUTO button 250, and thus, taped component 72 is conveyed to the supply position by the operation of feed-out device 102, and radial lead component 82 is supplied from the conveyed taped component to the work head of the electronic component mounting device at the supply position. However, since arrow mark 230 marked on feeder main body 70 comes to a position where it enters the inside of the cover provided in electronic component mounting device 10 when feeder main body 70 is positioned and mounted on mounting base 80 of electronic component mounting device 10, it is very difficult for the operator to visually confirm arrow mark 230.

Therefore, when taped component 72 is fed-out into conveyance path 100 by the operation of feed-out handle 188, the operator may stop the operation of feed-out handle 188 and operate AUTO button 250 although taped component 72 is not fed-out to the position of arrow mark 230. In other words, since it is difficult for the operator to confirm arrow mark 230, there would be a case where AUTO button 250 is operated by erroneously recognizing that taped component 72 is fed-out to arrow mark 230 although taped component 72 is fed-out to the position of arrow mark 230. In such a case, first feed-out claw member 114 and return preventing claw member 118 may not engage with feeding hole 90 of the carrier tape of taped component 72, and in such a case, taped component 72 is not fed-out toward the supply position even if AUTO button 250 is operated to activate feed-out device 102.

Meanwhile, when taped component 72 is fed-out into conveyance path 100 by the operation of feed-out handle 188, the operator may continuously operate feed-out handle 188 without stopping the operation of feed-out handle 188 although taped component 72 is fed-out to the position of arrow mark 230. In other words, since it is difficult for the operator to confirm arrow mark 230, there would be a case where the operator incorrectly recognizes that taped component 72 is not fed-out to arrow mark 230 although taped component 72 is fed-out to the position of arrow mark 230, and attempts to further feed-out taped component 72 to the inside of conveyance path 100. In such a case, taped component 72 is fed-out to the further inside of conveyance path 100 by further operating feed-out handle 188 by the operator from the state in which first feed-out claw member 114 and return preventing claw member 118 are engaged with feeding hole 90 of taped component 72 fed-out to arrow mark 230. At this time, since feed-out device 102 is not operating, taped component 72 engaged with first feed-out claw member 114 and return preventing claw member 118 that are stopped may be further fed-out from the rear side, thereby clogging the inside of conveyance path 100.

In view of such a problem, feeder main body 70 is provided with detection sensor 260 for detecting that taped component 72 is sent to the position engaged with first feed-out claw member 114 and return preventing claw member 118 of feed-out device 102. Specifically, detection sensor 260 is disposed at the same position as arrow mark 230 indicating that the feeding hole of the carrier tape of the taped component fed-out by operating feed-out handle 188 is in a position engaged with first feed-out claw member 114 and return preventing claw member 118. Detection sensor 260 is a transmissive optical sensor similar to detection sensor 156, and includes light projecting section 262 and light receiving section 264. Light projecting section 262 and light receiving section 264 are disposed below arrow mark 230 so as to face each other with conveyance path 100 therebetween. Therefore, in a case where taped component 72 is not present at the position indicated by the arrow mark in conveyance path 100, light emitted from the light projecting section 262 is received by light receiving section 264. Meanwhile, when taped component 72 is present at the position indicated by the arrow mark in conveyance path 100, taped component 72 blocks the light emitted from light projecting section 262, and thus, the presence of taped component 72 is detected by detection sensor 260. As a result, detection sensor 260 can detect whether taped component 72 is fed-out to the position indicated by arrow mark 230, that is, whether taped component 72 fed-out by operating feed-out handle 188 engages with first feed-out claw member 114 and return preventing claw member 118 of feed-out device 102.

As illustrated in FIG. 8, indicator lamp 252 is disposed on the upper surface of handle 240 adjacent to AUTO button 250. Indicator lamp 252 is turned off when taped component 72 is not detected by detection sensor 260, and is turned on when taped component 72 is detected by detection sensor 260. That is, indicator lamp is turned on when detection sensor 260 detects taped component 72. That is, indicator lamp 252 is turned off when taped component 72 is not fed-out to arrow mark 230, and when taped component 72 is fed-out to arrow mark 230, a signal is output from detection sensor 260 and is turned on. In addition, since handle 240 of feeder main body 70 is located outside the cover provided in electronic component mounting device 10 even when feeder main body 70 is positioned and mounted on mounting base 80 of electronic component mounting device 10, indicator lamp 252 disposed on the upper surface of handle 240 is also easy for the operator to visually recognize. Therefore, instead of arrow mark 230 that is located inside the cover provided in electronic component mounting device 10 and is difficult to visually recognize, the operator can operate feed-out handle 188 while confirming indicator lamp 252 located outside electronic component mounting device 10, and thus, taped component 72 can be appropriately fed-out to an appropriate feeding-out position indicated by arrow mark 230.

That is, when the operator operates feed-out handle 188 to feed-out taped component 72 to the inside of conveyance path 100 of feeder main body 70, the operator operates feed-out handle 188 while visually observing indicator lamp 252. At the timing when indicator lamp 252 is turned on, the operator stops the operation of feed-out handle 188 to stop the feeding-out of the taped component. First feed-out claw member 114 and return preventing claw member 118 engage with feeding hole 90 of taped component 72 that has been fed-out to and stopped at the appropriate feeding-out position indicated by arrow mark 230 in this state. After the indicator lamp is turned on and the feeding of the taped component is stopped, the operator operates AUTO button 250, and thus, feed-out device 102 is operated to feed-out taped component 72 that has been stopped to the supply position. In this manner, tape feeder 68 can appropriately feed-out taped component 72 to the component supply position by including detection sensor 260 that detects that taped component 72 is fed-out to the appropriate feeding-out position indicated by arrow mark 230, and indicator lamp 252 that notifies the detection of taped component 72 of detection sensor 260.

In addition, in tape feeder 68, the operator can automatically operate feed-out device 102 to feed-out taped component 72 to the supply position without operating AUTO button 250 after the operator feeds-out taped component 72 to the appropriate feeding-out position indicated by arrow mark 230 by operating feed-out handle 188. Specifically, as illustrated in FIG. 8, selection button 254 is also disposed on the upper surface of handle 240 of feeder main body 70 alongside AUTO button 250 and indicator lamp 252. Selection button 254 is a button for selecting either a fully automatic feed-out mode or a semi-automatic feed-out mode, and for example, by pressing selection button 254 once, the semi-automatic feed-out mode is selected, and further by pressing selection button 254 once, the fully automatic feed-out mode can be selected.

The semi-automatic feed-out mode is a feed-out mode in which the operator operates feed-out handle 188 to feed taped component 72, and when AUTO button 250 is operated after confirming that indicator lamp 252 is turned on, the operator operates feed-out device 102 to feed-out taped component 72 to the supply position. That is, when the semi-automatic feed-out mode is selected by selection button 254, the operator operates feed-out handle 188 until indicator lamp 252 is turned on, and when indicator lamp 252 is turned on, the operator cancels the operation of feed-out handle 188 and operates AUTO button 250. As a result of these operations, taped component 72 is fed-out to the supply position.

Meanwhile, the fully automatic feed-out mode is a feed-out mode in which, when the operator operates feed-out handle 188 to feed-out taped component 72 to the appropriate feeding-out position indicated by the arrow mark, feed-out device 102 is automatically operated to feed-out taped component 72 to the supply position even without the operator's operation of AUTO button 250. In other words, when the fully automatic feed-out mode is selected by selection button 254, the operator operates feed-out handle 188 to feed-out the taped component until indicator lamp 252 is turned on, and cancels the operation of feed-out handle 188 when indicator lamp 252 is turned on, similarly to the case where the semi-automatic feed-out mode is selected. When fully automatic feed-out mode is selected, detection sensor 260 outputs not only a signal for detecting taped component 72 and lighting indicator lamp 252, but also a signal for operating feed-out device 102. According to this signal, even when AUTO button 250 is not operated when indicator lamp 252 is turned on, feed-out device 102 feeds-out taped component 72 detected by the detection sensor to the supply position.

In the fully automatic feed-out mode, indicator lamp 252 is turned on at a timing when taped component 72 is fed-out to the appropriate feeding-out position indicated by arrow mark 230. That is, before feed-out device 102 is automatically operated to feed-out taped component 72 to the supply position, indicator lamp 252 is turned on. Accordingly, since the operator can visually recognize that the taped component is fed-out by feed-out device 102 by lighting indicator lamp 252 before feed-out device 102 is automatically operated, the operator can secure the safety of the operator himself/herself.

Tape feeder 68 is an example of a tape feeder. Taped component 72 is an example of a taped lead component. Radial lead component 82 is an example of a lead component. Conveyance path 100 is an example of a path. Feed-out device 102 is an example of a first feed-out device. Indicator lamp 252 is an example of a notification device. Detection sensor 260 is an example of a sensor.

In addition, the present disclosure is not limited to the embodiment that has been described heretofore and can be implemented in various aspects with various modifications and improvements based on the knowledge of those skilled in the art. Specifically, for example, in the above embodiment, the present disclosure is employed for tape feeder 68, that is, the radial feeder, but a tape feeder other than the radial feeder can be employed. Specifically, for example, the present disclosure can be adopted in an axial feeder or the like that supplies a component using a taped component in which an axial lead component is taped.

In the above embodiment, the operator operates feed-out handle 188 of guide unit 74 to feed-out taped component 72 to the position where detection sensor 260 detects the taped component, but the operator may insert taped component 72 to the position where detection sensor 260 detects the taped component without using guide unit 74 or the like. That is, the operator may insert taped component 72 through opening 111 of feeder main body 70, and insert taped component 72 to a position where detection sensor 260 detects taped component 72.

In addition, a detection sensor having the same configuration as detection sensor 260 may be disposed in guide unit 74. For example, the detection sensor may be disposed at a position where return preventing claw member 184 and feed-out claw member 186 of feed-out mechanism 164 in guide unit 74 are disposed, or at a position ahead of the disposed positions of return preventing claw member 184 and feed-out claw member 186, and at which the distal end of the taped component in a state where each claw member of the feed-out mechanism in the guide unit is engaged can be detected. When the disposed detection sensor detects taped component 72, indicator lamp 252 is turned on. As a result, it is possible to appropriately recognize that return preventing claw member 184 and feed-out claw member 186 are engaged with taped component 72 inserted into guide unit 74, and thus, that the taped component can be fed-out to the front side by the feed-out mechanism.

In the above embodiment, the feed-out claw member is engaged with the carrier tape of taped component 72 to feed-out taped component 72, but taped component 72 may be fed-out by engaging the feed-out claw member with the lead of the lead component taped by the taped component, the main body of the lead component, or the like. In addition, the shape of feed-out claw member 114 or the like is not limited to the claw shape, and taped component 72 may be fed-out by a member having another shape. For example, taped component 72 may be nipped by a pair of rollers or the like, and taped component 72 may be fed-out by rotating the rollers.

In the above embodiment, detection sensor 260 including light projecting section 262 and light receiving section 264, that is, the so-called transmission type light sensor is employed, but other types of sensors, such as a limited reflection type light sensor and an electromagnetic type sensor, may be employed. In the above embodiment, the pair of detection sensors 260 is disposed at an appropriate feeding-out position indicated by arrow mark 230, but multiple detection sensors may be disposed around arrow mark 230 to detect the taped component. As described above, in a case where multiple detection sensors are disposed at predetermined intervals in the vicinity of arrow mark 230, whether taped component 72 is present at an appropriate feeding-out position indicated by arrow mark 230 may be detected based on the detection results of all of the multiple detection sensors, or the presence or absence of taped component 72 at those positions may be detected based on the detection results of some detection sensors of the multiple detection sensors. In the above embodiment, the pair of detection sensors 260 is disposed in one feeder main body 70, but the pair of detection sensors 260 may be disposed in multiple feeder main bodies 70. In this case, as long as where multiple feeder main bodies 70 are detachably disposed so as to be positioned in parallel, the presence or absence of taped component 72 in each feeder main body 70 can be detected by a pair of detection sensors.

In the above embodiment, when taped component 72 is detected by detection sensor 260, indicator lamp 252 is turned on to execute the notification, but the detection of taped component 72 may be notified by turning off or blinking indicator lamp 252. In addition, the detection of taped component 72 may be notified by sound, vibration, screen display, or the like without being limited to notification by light. In other words, the detection signal of taped component 72 may be output from detection sensor 260 to a device that differs from tape feeder 68, such as electronic component mounting device 10, the control device of the electronic component mounting device 10, the management device that collectively manages multiple devices including electronic component mounting device 10, and the like, so that those devices notifies the detection of taped component 72.

In the above embodiment, detection sensor 260 detects taped component 72 fed-out to the position of first feed-out claw member 114 that is positioned and stopped at the predetermined position before the taped component is fed to the supply position, but may detect taped component 72 fed-out to a predetermined position different from the predetermined position before the taped component is fed to the supply position. However, in such a case, it is necessary that first feed-out claw member 114 moves to a different predetermined position. For example, in a case where first feed-out claw member 114 is positioned at a predetermined position before the taped component is fed to the supply position and is not stopped, first feed-out claw member 114 may be moved to the different predetermined position to engage with the feeding hole of the carrier tape in order to feed-out taped component 72 fed-out to the different predetermined position to the supply position, so that taped component 72 engaged by first feed-out claw member 114 in the direction of the supply position may be fed-out.

In the above embodiment, AUTO button 250 for operating feed-out device 102 and feeding-out taped component 72 to the supply position is provided in feeder main body 70, but guide unit 74, electronic component mounting device 10, a portable terminal, and the like may include AUTO button 250, and the feed-out device provided in the tape feeder may be operated by operating the button.

In the above embodiment, feed-out handle 188 of guide unit 74 is manually operated to feed-out taped component 72, but may be configured to automatically feed-out taped component 72. That is, a guide unit having an autoloading function of the taped component may be employed. For example, slide bracket 182 of feed-out mechanism 164 of guide unit 74 is automatically operated by using a driving source such as an electromagnetic motor or a cylinder. Then, the detection sensor is disposed at the disposition positions of return preventing claw member 184 and feed-out claw member 186 of feed-out mechanism 164, or at a position slightly ahead of the disposition positions, in the same manner as detection sensor 260 disposed in the feeder main body. In other words, a detection sensor is additionally disposed so as to detect that taped component 72 is inserted into a position that can be fed-out by return preventing claw member 184 and feed-out claw member 186 of the guide frame. Then, in a case where the operator inserts taped component 72 into guide frame 162 of guide unit 74, indicator lamp 252 is turned on when the added detection sensor detects taped component 72. When the operator operates AUTO button 250, slide bracket 182 is slid by the actuation of the driving source, so that taped component 72 inserted into the guide frame is fed-out toward the inside of feeder main body 70. Then, taped component 72 fed-out toward the inside of feeder main body 70 is fed-out to the supply position by the operation of feed-out device 102. As described above, the tape feeder having an autoloading function is obtained by arranging the driving source for actuating slide bracket 182 of guide unit 74 and the detection device for detecting that taped component 72 is inserted to the position at which feed-out claw member 186 can be fed-out. It should be noted that the autoloading function is a function of automatically feeding-out a taped component into which a tape feeder has inserted a predetermined length of one end of the taped component to the supply position where the tape feeder supplies the component. The predetermined length of the taped component to be inserted into the tape feeder may be a distance that can be detected by the detection sensor, or may be a distance at which the inserted taped component will not fall off the tape feeder. In the tape feeder configured as described above, feed-out mechanism 164 of guide unit 74 functions as an example of the first feed-out device, and feed-out device 102 of feeder main body 70 functions as an example of second feed-out device. That is, feed-out mechanism 164 of guide unit 74 functions a device for feeding-out taped component 72 toward feed-out device 102, and feed-out device 102 of feeder main body 70 functions as a device for feeding-out taped component 72 to the supply position. As in the above embodiment, the guide unit for supplying the taped component to the two tape feeders may be one or may be provided in each tape feeder. As in the above embodiment, the feeder main body and the guide unit may be detachable and may be separate bodies, or may be integrally configured as a single tape feeder. In addition, the driving source of feed-out mechanism 164 and the driving source of feed-out device 102 may be the same or different from each other. Further, either the feed-out mechanism or the feed-out device may be omitted, and the taped component inserted into the tape feeder may be fed-out to the supply position by a mechanism for feeding one taped component.

REFERENCE SIGNS LIST

70: tape feeder, 72: taped component (taped lead component), 82: radial lead component (lead component), 100: conveyance path (path), 102: feed-out device (first feed-out device) (second feed-out device), 164: feed-out mechanism (first feed-out device), 252: indicator lamp (notification device), 260: detection sensor (sensor)

The invention claimed is:

1. A tape feeder comprising:
    a path through which a taped lead component, in which a lead component is taped, is fed-out to a supply position, the taped lead component including a main body and multiple leads extending from a bottom surface of the main body, the multiple leads being taped to a carrier tape and guided by the path so that the multiple leads extend in an up-down direction of the tape feeder;
    a sensor disposed in the path to detect the taped lead component; and
    a notification device configured to notify of detection of the taped lead component when the taped lead component is detected by the sensor.

2. The tape feeder of claim 1,
    wherein the tape feeder includes a first feed-out device configured to feed-out the taped lead component in the path toward the supply position, and
    the sensor detects that the taped lead component is in a position at which the taped lead component is fed-out by the first feed-out device.

3. The tape feeder according to claim 2,
    wherein the first feed-out device feeds-out the taped lead component toward the supply position when the detection of the taped lead component is notified by the notification device and a user operation is received.

4. The tape feeder according to claim 2,
    wherein the tape feeder includes a second feed-out device configured to feed-out the taped lead component fed-out by the first feed-out device to the supply position.

* * * * *